US010246335B2

(12) United States Patent
DiGiovanni et al.

(10) Patent No.: US 10,246,335 B2
(45) Date of Patent: Apr. 2, 2019

(54) METHODS OF MODIFYING SURFACES OF DIAMOND PARTICLES, AND RELATED DIAMOND PARTICLES AND EARTH-BORING TOOLS

(71) Applicant: Baker Hughes, a GE company, LLC, Houston, TX (US)

(72) Inventors: Anthony A. DiGiovanni, Houston, TX (US); Steven W. Webb, The Woodlands, TX (US); Marc W. Bird, Houston, TX (US)

(73) Assignee: Baker Hughes, a GE company, LLC, Houston, TX (US)

( * ) Notice: Subject to any disclaimer, the term of this patent is extended or adjusted under 35 U.S.C. 154(b) by 78 days.

(21) Appl. No.: 15/167,781

(22) Filed: May 27, 2016

(65) Prior Publication Data
US 2017/0341940 A1 Nov. 30, 2017

(51) Int. Cl.
*C01B 32/25* (2017.01)
*C01B 32/28* (2017.01)
(Continued)

(52) U.S. Cl.
CPC .............. *C01B 32/25* (2017.08); *C01B 32/28* (2017.08); *C22C 19/03* (2013.01); *C23C 14/18* (2013.01); *C23C 14/34* (2013.01); *C23C 14/5806* (2013.01); *C23C 14/5846* (2013.01); *C23C 14/5873* (2013.01); *E21B 10/46* (2013.01);
(Continued)

(58) Field of Classification Search
CPC ..... C01B 32/25; C01B 32/28; C23C 14/5846; C23C 14/34; C23C 14/18; C23C 14/5873; C23C 14/5806; C23C 19/03; E21B 10/46; C22C 19/03; C23F 1/44; C23F 1/34; C23F 1/18
See application file for complete search history.

(56) References Cited

U.S. PATENT DOCUMENTS 3,269,881 A 8/1966 Alderuccio et al.
3,351,543 A 11/1967 Vanderslice
(Continued)

FOREIGN PATENT DOCUMENTS

JP 05306433 A * 11/1993
WO 2015199796 A2 12/2015
(Continued)

OTHER PUBLICATIONS

Allen, W.P. et al, "Decomposition reactions and toughening in NiAl—Cu alloys." Mat Res Soc Symp Proc, vol. 194, pp. 405-412. (Year: 1990).*
(Continued)

*Primary Examiner* — Anita K Alanko
(74) *Attorney, Agent, or Firm* — TraskBritt

(57) ABSTRACT

A method of modifying surfaces of diamond particles comprises forming spinodal alloy coatings over discrete diamond particles, thermally treating the spinodal alloy coatings to form modified coatings each independently exhibiting a reactive metal phase and a substantially non-reactive metal phase, and etching surfaces of the discrete diamond particles with at least one reactive metal of the reactive metal phase of the modified coatings. Diamond particles and earth-boring tools are also described.

20 Claims, 2 Drawing Sheets

(51) Int. Cl.

| | | |
|---|---|---|
| *C22C 19/03* | (2006.01) | |
| *C23C 14/18* | (2006.01) | |
| *C23C 14/34* | (2006.01) | |
| *C23C 14/58* | (2006.01) | |
| *E21B 10/46* | (2006.01) | |
| *E21B 10/54* | (2006.01) | |
| *E21B 10/56* | (2006.01) | |
| *C23F 1/44* | (2006.01) | |
| *C23F 1/34* | (2006.01) | |
| *C23F 1/18* | (2006.01) | |

(52) U.S. Cl.
CPC .............. *E21B 10/54* (2013.01); *E21B 10/56* (2013.01); *C23F 1/18* (2013.01); *C23F 1/34* (2013.01); *C23F 1/44* (2013.01)

(56) References Cited

U.S. PATENT DOCUMENTS

| | | | |
|---|---|---|---|
| 3,650,714 A | | 3/1972 | Farkas |
| 3,871,840 A | * | 3/1975 | Wilder ................. B24D 7/00 427/215 |
| 4,525,325 A | | 6/1985 | Livak |
| 4,641,976 A | * | 2/1987 | Kar ..................... C22C 9/00 175/371 |
| 5,035,771 A | * | 7/1991 | Borse ................... C04B 41/53 216/75 |
| 6,149,785 A | * | 11/2000 | Makowiecki ........... B22F 1/025 204/298.11 |
| 6,727,117 B1 | * | 4/2004 | McCoy ............... H01L 23/3732 257/684 |
| 8,182,562 B2 | | 5/2012 | Dumm et al. |
| 8,652,226 B2 | | 2/2014 | Dumm et al. |
| 8,927,101 B2 | | 1/2015 | Dumm et al. |
| 9,845,417 B2 | * | 12/2017 | Dumm ................. C09K 3/1445 |
| 2004/0137229 A1 | | 7/2004 | Mudholkar et al. |
| 2008/0268288 A1 | * | 10/2008 | Jin ..................... B81C 1/00031 428/800 |
| 2012/0085585 A1 | * | 4/2012 | Scott ..................... B22D 19/14 175/428 |
| 2012/0100366 A1 | | 4/2012 | Dumm et al. |
| 2014/0148082 A1 | | 5/2014 | Dumm et al. |
| 2014/0179203 A1 | | 6/2014 | Dumm et al. |
| 2015/0013234 A1 | | 1/2015 | Krishnan |

FOREIGN PATENT DOCUMENTS

| | | |
|---|---|---|
| WO | 2016054815 A1 | 4/2016 |
| WO | 2016054816 A1 | 4/2016 |

OTHER PUBLICATIONS

Cakir, O. Copper Etching With Cupric Chloride and Regeneration of Wast Etchant, 12the International Scientific Conference, Proceedings of the 12th International Scientific Conference on "Achievements in Mechanical and Materials Engineering" AMM✤ 2003, Gliwice-Zakopane, 2003, 139-143.

Schwartz et al., Spinodal Decomposition in a Cu-9 wt% Ni-6 wt% Sn Alloy, Acta Metallurgica, vol. 22, May 1974, pp. 601-609.

Zhao et al., Spinodal Decomposition, Ordering Transformation, and Discontinuous Precipitation in a Cu—15Ni—8Sn Alloy, Acta mater. (1998), vol. 46, No. 12, pp. 4203-4218.

International Search Report for International Application No. PCT/US2017/034550 dated Aug. 31, 2017, 3 pages.

International Written Opinion for International Application No. PCT/US2017/034550 dated Aug. 31, 2017, 3 pages.

* cited by examiner

US 10,246,335 B2

METHODS OF MODIFYING SURFACES OF DIAMOND PARTICLES, AND RELATED DIAMOND PARTICLES AND EARTH-BORING TOOLS

TECHNICAL FIELD

The disclosure, in various embodiments, relates generally to methods of modifying surfaces of diamond particles, and to related diamond particles and earth-boring tools.

BACKGROUND

Diamond particles have proven useful in wide variety of applications (e.g., drilling applications, cutting applications, grinding applications, polishing applications, machining applications, etc.). For example, many earth-boring tools have components (e.g., polycrystalline diamond compact (PDC) cutting elements) including inter-bonded diamond particles, and/or components (e.g., bit bodies, inserts, etc.) including discrete (e.g., non-inter-bonded) diamond particles dispersed in a matrix material. Including diamond particles (e.g., inter-bonded diamond particles and/or discrete diamond particles) in such earth-boring tools can increase the operational life of the earth-boring tools by increasing the strength and abrasion resistance of the earth-boring tools. Diamond particles are also frequently utilized as additives for coatings (e.g., hardfacing), lubricants (e.g., oils), slurries (e.g., polishing slurries), and structures (e.g., polymer structures) to provide the coatings, lubricants, slurries, and structures with desirable properties (e.g., strength, abrasion resistance, abrasivity, thermal conductivity, electrical conductivity, etc.). Many applications would benefit from diamond particles exhibiting particularly textured surfaces and/or relatively larger specific surface areas.

BRIEF SUMMARY

Embodiments described herein include methods of modifying surfaces of diamond particles, as well as related diamond particles and earth-boring tools. For example, in accordance with one embodiment described herein, a method of modifying surfaces of diamond particles comprises forming spinodal alloy coatings over discrete diamond particles, thermally treating the spinodal alloy coatings to form modified coatings each independently exhibiting a reactive metal phase and a substantially non-reactive metal phase, and etching surfaces of the discrete diamond particles with at least one reactive metal of the reactive metal phase of the modified coatings.

In additional embodiments, a diamond particle comprises a textured surface exhibiting elevated regions and recessed regions between the elevated regions, lateral dimensions and spacing of the recessed regions respectively corresponding to lateral dimensions and spacing of regions of at least one phase of a spinodally decomposed alloy substantially reactive with diamond at a temperature greater than or equal to about 650° C.

In further embodiments, an earth-boring tool comprises at least one structure comprising diamond particles, at least one of the diamond particles having a textured surface exhibiting elevated regions and recessed regions between the elevated regions, lateral dimensions and spacing of the recessed regions respectively corresponding to lateral dimensions and spacing of regions of at least one phase of a spinodally decomposed alloy substantially reactive with diamond at a temperature greater than or equal to about 650° C.

DETAILED DESCRIPTION

Figure 1:
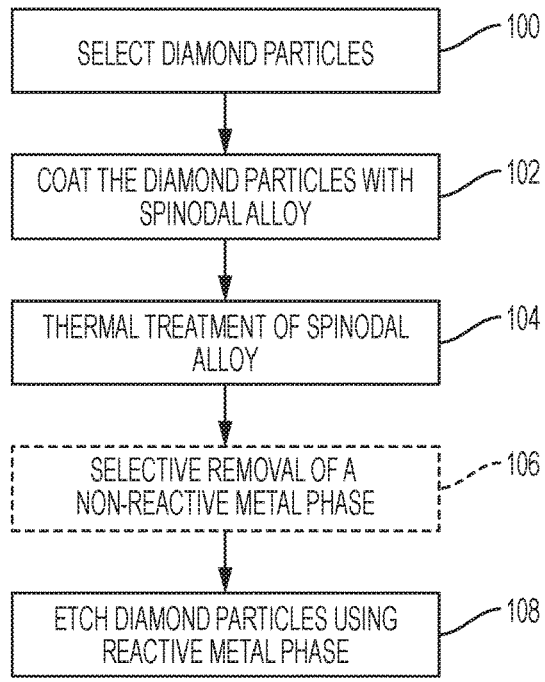
FIG. 1 is a simplified flow diagram depicting a method of modifying surfaces of diamond particles, in accordance with embodiments of the disclosure.

Methods of modifying surfaces of diamond particles are described, as are related diamond particles and earth-boring tools. In some embodiments, a method of modifying surfaces of diamond particles includes forming spinodal alloy coatings over discrete diamond particles to form discrete composite particles. The discrete composite particles are subjected to a thermal treatment process to form modified coatings each exhibiting at least two coexisting, isomorphous phases having different material compositions than one another. Thereafter, portions of the discrete diamond particles are removed using a reactive metal of one of the coexisting, isomorphous phases of the modified coatings. The reactive metal may react with a portion of a diamond particle thereunder to destroy the crystallinity of the portion of the diamond particle. Optionally, another of the coexisting, isomorphous phases of the modified coatings may be selectively removed (e.g., selectively etched) prior to removing portions of the discrete diamond particles using the reactive metal of the other of the coexisting, isomorphous phases. The methods of the disclosure facilitate the controlled, consistent formation of diamond particles exhibiting desirable surface configurations (e.g., feature sizes, feature spacing, etc.).

The following description provides specific details, such as material types and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a structure or tool. Only those process acts and structures necessary to understand the embodiments of the disclosure are described in detail below. Additional acts to form the complete structure or the complete tool from various structures may be performed by conventional fabrication techniques. The drawings accompanying the present application are for illustrative purposes only, and are not drawn to scale. Additionally, elements common between figures may retain the same numerical designation.

As used herein, the terms "comprising," "including," "containing," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, spatially relative terms, such as "beneath," "below," "lower," "bottom," "above," "upper," "top," "front," "rear," "left," "right." and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIG. 1 is a simplified flow diagram illustrating a method of modifying (e.g., texturing) surfaces of diamond particles, in accordance embodiments of the disclosure. As described in further detail below, the method includes a diamond particle selection process 100, a spinodal alloy coating process 102, a thermal treatment process 104, an optional selective phase removal process 106, and a diamond etching process 108. With the description as provided below, it will be readily apparent to one of ordinary skill in the art that the method described herein may be used in various applications. In other words, the method may be used whenever it is desired to form modify (e.g., texture) a surface of a diamond particle.

The diamond particle selection process 100 includes selecting discrete diamond particles to be subsequently formed into modified diamond particles exhibiting textured surfaces. The discrete diamond particles may be selected at least partially based on a desired end use of the modified diamond particles, as described in further detail below. The discrete diamond particles may be formed of and include monocrystalline diamond, polycrystalline diamond, or combinations thereof. Each of the discrete diamond particles may independently exhibit a desired particle size, such as a particle size less than or equal to about 1000 micrometers ($\mu m$). The discrete diamond particles may comprise, for example, one or more of discrete micro-sized diamond particles and discrete nano-sized diamond particles. As used herein, the term "micro-sized" means and includes a particle size with a range of from about one (1) $\mu m$ to about 1000 $\mu m$, such as from about 1 $\mu m$ to about 500 $\mu m$, from about 1 $\mu m$ to about 100 $\mu m$, or from about 1 $\mu m$ to about 50 $\mu m$. As used herein, the term "nano-sized" means and includes a particle size of less than 1 $\mu m$, such as less than or equal to about 500 nanometers (nm), or less than or equal to about 250 nm. In addition, each of the discrete diamond particles may independently exhibit a desired shape, such as one or more of a spherical shape, a hexahedral shape, an ellipsoidal shape, a cylindrical shape, a conical shape, and an irregular shape. The discrete diamond particles may be monodisperse, wherein each of the discrete diamond particles exhibits substantially the same material composition, size, and shape, or may be polydisperse, wherein at least one of the discrete diamond particles exhibits one or more of a different material composition, a different particle size, and a different shape than at least one other of the discrete diamond particles.

The spinodal alloy coating process 102 includes coating the discrete diamond particles with at least one spinodal alloy to form discrete composite particles. As used herein, the term "spinodal alloy" means and includes an alloy having a chemical composition capable of undergoing spinodal decomposition. In turn, as used herein, the term "spinodal decomposition" refers to a mechanism of continuous phase transformation by which a homogeneous disordered solution (e.g., a solid solution, a liquid solution) separates into distinct phases. The distinct phases may include ordered phases and/or disordered phases. The phase separation is a result of driving forces derived from energetic instabilities pertaining to the nucleation and growth of the equilibrium ordered structures in the two phase field. In solids, spinodal decomposition is controlled by local atomistic diffusion of constituent materials forming a modulated composition profile such that the bulk (average) composition is unchanged. Furthermore, as used herein, the term "composite particle" means and includes a particle including at least two constituent materials that remain distinct on a micrometric level while forming a single particle. For example, each of the discrete composite particles may independently include a diamond particle at least partially (e.g., substantially) encapsulated (e.g., covered, surrounded, etc.) by a coating (shell, layer, etc.) of the spinodal alloy.

The spinodal alloy includes at least one metal element (hereinafter referred to as a "reactive metal") that is reactive with diamond. As used herein, a material (e.g., a metal) that is "reactive" with diamond refers to a material that breaks down the crystallinity of diamond at one or more temperatures. Conversely, a material (e.g., a metal) that is substantially "non-reactive" with diamond refers to a material that does not substantially break down the crystallinity of diamond at the one or more temperatures. The reactive metal may, for example, dissolve diamond at one or more elevated temperatures, such as a temperature greater than or equal to about 650° C., whereas a substantially non-reactive metal may not substantially dissolve diamond at the one or more elevated temperatures. The reactive metal may facilitate modification of the surface texture of the diamond particles of the discrete composite particles through selective removal of portions of the diamond particles, as described in further detail below. For example, the spinodal alloy may comprise one or more of a nickel-containing spinodal alloy, an iron-containing alloy, and a cobalt-containing alloy, such as one or more of a copper-nickel (Cu—Ni) spinodal alloy, a copper-nickel-tin (Cu—Ni—Sn) spinodal alloy, a copper-nickel-tin-cobalt (Cu—Ni—Sn—Co) spinodal alloy, a gold-nickel spinodal alloy (Au—Ni), a nickel-platinum spinodal alloy (Ni—Pt), a nickel-rhodium spinodal alloy (Ni—Rh), a cobalt-nickel-iron spinodal alloy (Co—Ni—Fe), a cobalt-iron spinodal alloy (Co—Fe), a cobalt-platinum spinodal alloy (Co—Pt), and an iron-rhodium spinodal alloy (Fe—Rh). In some embodiments, the spinodal alloy comprises a Cu—Ni spinodal alloy. The spinodal Cu—Ni alloy may, for example, include from about 50 weight percent (wt %) nickel (Ni) to about 90 wt % Ni, and from about 10 wt % copper (Cu) to about 50 wt % Cu. In additional embodiments, the spinodal alloy comprises a Cu—Ni—Sn spinodal alloy. The Cu—Ni—Sn alloy may, for example, include from about 5 wt % Ni to about 35 wt % Ni, from about 6 wt % Sn to about 13 wt % Sn, and from about 52 wt % Cu to about 89 wt % Cu. Non-limiting examples of suitable Cu—Ni—Sn spinodal alloys include Cu-9Ni-6Sn (9 wt % Ni, 6 wt % Sn, 85 wt % Cu) and Cu-15Ni-8Sn (15 wt % Ni, 8 wt % Sn, 77 wt % Cu). The spinodal alloy may be selected at least partially based on desired dimensions and desired spacing of distinct phases (e.g., a reactive metal phase and a non-reactive metal phase) to be formed through subsequent thermal treatment of the spinodal alloy, as well as on an upper critical solution temperature boundary for a miscibility gap (e.g., an area within a coexistence curve of a phase diagram, such as an isobaric phase diagram, where at least two distinct phases coexist) of the spinodal alloy, as also described in further detail below.

Each of the discrete composite particles may be formed to exhibit any desired thickness of the spinodal alloy coating over the diamond particle thereof. Thicknesses of the spinodal alloy coatings of the discrete composite particles may at least partially depend on the geometric configurations (e.g., sizes and shapes) of the diamond particles, and on the process used to form the spinodal alloy coatings on the diamond particles. By way of non-limiting example, each of the discrete composite particles may independently exhibit a spinodal alloy coating thickness of greater than or equal to about one (1) nm.

The spinodal alloy coatings may be formed on or over the discrete diamond particles using conventional equipment and conventional processes, which are not described in detail herein. By way of non-limiting example, the spinodal alloy coatings may be formed on or over the discrete composite particles using one or more of physical vapor deposition (PVD) (e.g., sputtering, evaporation, ionized PVD, etc.), plasma enhanced physical vapor deposition (PEPVD), chemical vapor deposition (CVD), plasma enhanced chemical vapor deposition (PECVD), atomic layer deposition (ALD), plasma enhanced atomic layer deposition (PEALD), electrolytic plating, spin-coating, dip coating, spray coating, and blanket coating. In some embodiments, the spinodal alloy of the spinodal alloy coatings is formed separate from the discrete diamond particles and then deposited on or over the discrete diamond particles to form the discrete composite particles. In additional embodiments, the spinodal alloy of the spinodal alloy coatings is formed on or over the discrete diamond particles by depositing (e.g., sequentially depositing, simultaneously depositing, etc.) precursors (e.g., metal elements, organometallic compounds, etc.) to the spinodal alloy on or over the discrete diamond particles and then treating (e.g., heating, reacting, etc.) the precursors to form the spinodal alloy. As a non-limiting example, different metal atoms (e.g., Ni atoms, Cu atoms, Sn atoms, etc.) may be sputtered from surfaces of different metal sources (e.g., a Ni source, a Cu source, an Sn source, etc.) and may be deposited on or over surfaces of the discrete diamond particles while the discrete diamond particles are mobilized on, over, or within a particle dispersing apparatus (e.g., a vibrating structure, a fluidized bed, etc.). The different deposited metal atoms may interact (e.g., mix) with one another in presence of applied thermal energy to form the spinodal alloy. The different metal atoms may be simultaneously sputtered (e.g., co-sputtered) from the different metal sources to form the spinodal alloy, and/or may be sequentially sputtered from the different metal sources to form different metallic layers (e.g., a Cu layer, a Ni layer, a Sn layer, etc.) that may then interact with one another to form the spinodal alloy. For each metal element (e.g., Ni, Cu, Sn, etc.) of the spinodal alloy, an amount of metal atoms (e.g., Ni atoms, Cu atoms, Sn atoms, etc.) sputtered from a corresponding metal source (e.g., a Ni source, a Cu source, a Sn source, etc.) may be controlled to control a concentration of the metal element in the resulting spinodal alloy.

With continued reference to FIG. 1, the thermal treatment process 104 includes subjecting the discrete composite particles to controlled thermal treatment to convert the spinodal alloy coatings of the discrete composite particles into modified coatings (e.g., spinodally decomposed alloy coatings and/or spatially disordered alloy coatings) exhibiting at least two coexisting, isomorphous phases having different material compositions than one another. For example, each of the modified coatings may exhibit a two-phase structure including a reactive metal phase (e.g., a Ni phase, a Ni—Sn phase, etc.) and a substantially non-reactive metal phase (e.g., a Cu phase). The reactive metal phase may be dispersed throughout the non-reactive metal phase, or the non-reactive metal phase may be dispersed throughout the reactive metal phase. As described in further detail below, the thermal treatment process 104 may include homogenizing the spinodal alloy coatings at one or more temperatures above an upper critical solution temperature (UCST) of the spinodal alloy, quenching the homogenized spinodal alloy coatings to one or more temperatures below a temperature range of a spinodal region of a miscibility gap of the spinodal alloy, and heating (e.g., annealing) of the quenched spinodal alloy coatings at one or more temperatures within the temperature range of the spinodal region of the miscibility gap of the spinodal alloy for a predetermined period of time to ensure decomposition occurs without the onset of ordering reactions that may render a reactive metal phase substantially non-reactive per standard time-temperature-transformation (TTT) response for the spinodal alloy.

The homogenization of the spinodal alloy coatings of the discrete composite particles may employ any homogenization (e.g., solution treatment) temperature above the UCST of the spinodal alloy and duration sufficient to form a solid solution of the metal elements (e.g., Cu, Ni, Sn, etc.) of the spinodal alloy coatings. The homogenization temperature and duration may be selected at least partially based on the material composition of the spinodal alloy coatings. In some embodiments, homogenization of the spinodal alloy coatings of the discrete composite particles includes heating the discrete composite particles to a temperature greater than or equal to about 650° C. (e.g., within a range of from about 650° C. to about 900° C., such as from about 700° C. to about 850° C.) for a duration greater than or equal to about 15 seconds (e.g., within a range of from about 15 seconds to about 15 minutes, such as from about 30 seconds to about 10 minutes, or from about 60 seconds to about 5 minutes). As a non-limiting example, in some embodiments wherein the spinodal alloy coatings are formed of and include a Cu—Ni—Sn spinodal alloy (e.g., Cu-9Ni-6Sn, Cu-15Ni-8Sn, etc.), the discrete composite particles may be heated to a temperature greater than or equal to about 500° C. (e.g., within a range of from about 500° C. to about 850° C., such as from about 650° C. to about 850° C., from about 800° C. to about 850° C., or from about 825° C. to about 850° C.) for greater than or equal to about 3 minutes (e.g., within a range of from about 3 minutes to about 100 hours) to homogenize the spinodal alloy coatings thereof. As another non-limiting example, in some embodiments wherein the spinodal alloy coatings are formed of and include a Cu—Ni spinodal alloy, the discrete composite particles may be heated to a temperature greater than or equal to about 650° C. (e.g., within a range of from about 650° C. to about 800° C.) for greater than or equal to about 3 minutes (e.g., within a range of from about 3 minutes to about 100 hours) to homogenize the spinodal alloy coatings thereof.

The quench of the homogenized spinodal alloy coatings of the discrete composite particles may rapidly cool the homogenized spinodal alloy coatings to a temperature below the temperature range of the spinodal region of the spinodal alloy, such as a temperature between about 15° C. and a lower temperature boundary of the spinodal region of the spinodal alloy. The homogenized spinodal alloy coatings may, for example, be cooled at a rate greater than or equal to about 100° C. per minute, such as greater than or equal to about 110° C. per minute, greater than or equal to about 125° C. per minute, or greater than or equal to about 150° C. per minute. The quench may employ any suitable quenching media, such as one or more of water, a saline solution (e.g., brine), sodium hydroxide, caustic soda, an oil (e.g., prepared oil, fuel oil, etc.), liquid nitrogen, air, and an inert gas.

Following the quench, the quenched spinodal alloy coatings of the discrete composite particles may be heated to and maintained at any temperature within the temperature range of the spinodal region of the spinodal alloy for any period of time sufficient to facilitate the formation of at least two coexisting, isomorphous phases (e.g., a Ni phase and a Cu phase; a Ni—Sn phase and a Cu phase; etc.) having different material compositions than one another in accordance with the TTT diagram. As a non-limiting example, in some embodiments wherein the spinodal alloy coatings of the discrete composite particles are formed of and include a Cu—Ni—Sn spinodal alloy (e.g., Cu-9Ni-6Sn, Cu-15Ni-8Sn, etc.), after being quenched, the discrete composite particles may be heated to a temperature within a range of from about 225° C. to about 550° C. (e.g., from about 225° C. to about 525° C., from about 225° C. to about 500° C., or from about 225° C. to about 400° C.) for greater than or equal to about 15 seconds (e.g., within a range of from about 15 seconds to about one (1) week, from about 15 seconds to about 24 hours, from about 15 seconds to about one (1) hour, from about 15 seconds to about 30 minutes, etc.) to convert the quenched spinodal alloy coatings into the modified coatings. As another non-limiting example, in some embodiments wherein the spinodal alloy coatings are formed of and include a Cu—Ni spinodal alloy, following quenching, the discrete composite particles may be heated to a temperature within a range of from about 200° C. to about 322° C. (e.g., within a range of from about 250° C. to about 300° C.) for greater than or equal to about 15 seconds (e.g., within a range of from about 15 seconds to about one week, from about 15 seconds to about 24 hours, from about 15 seconds to about one (1) hour, from about 15 seconds about 30 minutes, etc.) to convert the quenched spinodal alloy coatings into the modified coatings.

Next, with continued reference to FIG. 1, the optional selective phase removal process 106, if performed, may include selectively removing at least one of the coexisting, isomorphous phases (e.g., at least one substantially non-reactive phase) of the modified coatings of the discrete composite particles relative to at least one other of the coexisting, isomorphous phases (e.g., at least one reactive phase). The selective phase removal process 106 may, for example, remove a substantially non-reactive metal phase (e.g., a metal phase that is not substantially reactive with diamond) of the modified coatings without substantially removing a reactive metal phase (e.g., a metal phase that is substantially reactive with diamond) of the modified coatings. As a non-limiting example, if the modified coatings comprise spinodally decomposed Cu—Ni alloy coatings, the selective phase removal process 106 may remove (e.g., completely remove) a Cu phase of the spinodally decomposed Cu—Ni alloy coatings without substantially removing a Ni phase of the spinodally decomposed Cu—Ni alloy coatings. As another non-limiting example, if the modified coatings comprise spinodally decomposed Cu—Ni—Sn alloy coatings, the selective phase removal process 106 may remove (e.g., completely remove) a Cu phase of the spinodally decomposed Cu—Ni—Sn alloy coatings without substantially removing a Ni—Sn phase of the spinodally decomposed Cu—Ni—Sn alloy coatings. The reactive metal phase of the modified coatings remaining following the selective phase removal process 106 may be used to remove portions of the diamond particles thereunder through subsequent processing, as described in further detail below.

The selective phase removal process 106, if performed, may include contacting the discrete composite particles to at least one wet etchant formulated to selectively etch a substantially non-reactive metal phase (e.g., a Cu phase) of the modified coatings relative to a reactive metal phase (e.g., a Ni phase, a Ni—Sn phase, etc.) of the modified coatings. As used herein, the term "selectively etch" means a material (e.g., Cu) is etched at a rate at least about five times (5×) greater than that of another material (e.g., Ni), such as about ten times (10×) greater, about twenty times (20×) greater, or about forty times (40×) greater. By way of non-limiting example, if the modified coatings comprise one or more of spinodally decomposed Cu—Ni alloy coatings and spinodally decomposed Cu—Ni—Sn alloy coatings (e.g., spinodally decomposed Cu-9Ni-6Sn alloy coatings, spinodally decomposed Cu-15Ni-8Sn alloy coating, etc.), the selective phase removal process 106 may include contacting the discrete composite particles with one or more of a cupric chloride ($CuCl_2$) solution, a ferric chloride ($FeCl_3$) solution, a potassium dichromate ($K_2Cr_2O_7$) solution, a glacial acetic acid ($CH_3COOH$) solution, a chromic/sulfuric acid solution, an peroxydisulfuric acid ($H_2S_2O_8$) solution, an alkaline sodium chlorite solution, an alkaline peroxydisulfate solution, and an alkaline persulfate (e.g., sodium persulfate, ammonium persulfate, potassium persulfate, etc.) solution. In some embodiments, the selective phase removal process 106 includes contacting the discrete composite particles with a $CuCl_2$ solution to selectively remove a Cu phase of the modified coatings thereof relative to another phase (e.g., a Ni phase, a Ni—Sn phase, etc.) of the modified coatings. One or more of a chemical composition and a temperature of the wet etchant may be controlled (e.g., selected, maintained, etc.) to facilitate a desired etch rate of the non-reactive metal phase of the modified coatings. By way of non-limiting example, if the wet etchant comprises a $CuCl_2$ solution, one or more of a concentration of $CuCl_2$ in the solution, a type and an amount of one or more additives (e.g., hydrochloric acid (HCl), ammonium chloride ($NH_4Cl$), etc.) in the solution, and a temperature of the $CuCl_2$ solution may be selected to facilitate a desired etch rate of a Cu phase of the modified coatings of the discrete composite particles. In some embodiments, the selective phase removal process 106 comprises exposing the discrete composite particles to an aqueous $CuCl_2$ solution having a temperature within a range of from about 30° C. to about 70° C. (e.g., from about 35° C. to about 65° C., or from about 40° C. to about 60° C., from about 45° C. to about 55° C., or about 50° C.), and including up to about 2.5 Mol $CuCl_2$ (e.g., from about 0.1 Mol $CuCl_2$ about 2.5 Mol $CuCl_2$, such as from about 1.0 Mol $CuCl_2$ about 2.5 Mol $CuCl_2$, or from about 2.0 Mol $CuCl_2$ about 2.5 Mol $CuCl_2$), from about 0 Mol HCl to about 3 Mol HCl (e.g., from about 1 Mol HCl to about 3 Mol HCl), from about 0 Mol $NH_4Cl$ to about 3 Mol $NH_4Cl$ (e.g., from about 1 Mol $NH_4Cl$ to about 3 Mol $NH_4Cl$). The wet etchant may be provided in contact with the modified coatings of the discrete composite particles using one or more conventional processes (e.g., a conventional immersion process, a conventional soaking process, a conventional spraying process, a conventional spin-coating process, a conventional vapor-coating process, etc.) and conventional processing equipment, which are not described in detail herein.

In additional embodiments, the selective phase removal process 106 may be omitted. For example, if an UCST of the spinodal alloy (e.g., Cu—Ni alloy, Cu—Ni—Sn alloy) of the modified coatings of the discrete composite particles is greater than or equal to a temperature employed to subsequently remove portions of the diamond particles of the discrete composite particles using a reactive metal phase (e.g., Ni phase, Ni—Sn phase, etc.) of the modified coatings, the selective phase removal process 106 may, optionally, be omitted. Conversely, if the UCST of a spinodal alloy of the modified coatings is less than a temperature employed to subsequently remove portions of the diamond particles of the discrete composite particles using a reactive metal phase of the modified coatings, the selective phase removal process 106 may be employed (e.g., effectuated) to prevent remixing of the coexisting phases (e.g., reactive metal phase and non-reactive metal phase) of the modified coatings.

Still referring to FIG. 1, the diamond etching process 108 includes heating the discrete composite particles to react the diamond particles thereof with reactive metal (e.g., Ni) of the reactive metal phase (e.g., Ni phase, Ni—Sn phase) of the modified coatings to form modified diamond particles exhibiting desirable surface textures (e.g., a surfaces exhibiting desirable feature sizes, shapes, and spacing, such as desirable sizes, shapes, and spacing of recessed regions and elevated regions). The diamond etching process 108 may, for example, include heating the discrete composite particles at a temperature greater than or equal to about 650° C. (e.g., within a range of from about 650° C. to about 1000° C., such as from about 700° C. to about 900° C., or from about 750° C. to about 850° C.) for greater than or equal to about 30 seconds (e.g., greater than or equal to about one (1) minute, greater than or equal to about ten (10) minutes, greater than or equal to about 30 minutes, greater than or equal to about one (1) hour, or greater than or equal to about two (2) hours) in one or more of a reducing atmosphere, a vacuum atmosphere, and an inert gas atmosphere to form the modified diamond particles. During the diamond etching process 108 heated particles of the reactive metal may destroy the crystallinity of portions of the diamond particles at interfaces of the reactive metal phase and the portions of the diamond particles to produce amorphous carbon that may be diffused into and through the reactive metal to form the recesses in the surfaces of the diamond particles. A shape, lateral size (e.g., width, length), and spacing of the removed portions of the diamond particles may correspond to (e.g., be substantially the same as) a shape, lateral size, and spacing of the reactive metal phase of the spinodally decomposed alloy coatings (and/or the spatially disordered alloy coatings). A morphology of the modified diamond particles may be assessed using one or more conventional processes (e.g., a laser-based particle assessment process, optical and scanning electron microscopy, BET gas adsorption, etc.) and conventional processing equipment, which are not described in detail herein.

Following the diamond etching process 108, at least one cleaning process may be performed to remove material (e.g., a remaining reactive metal phase, remaining substantially non-reaction metal phase, etc.) overlying the modified diamond particles. For example, at least one acid treatment process (e.g., a hydrochloric acid treatment process, a hydrofluoric acid treatment process, a nitric acid treatment process, etc.) may be performed to remove (e.g., completely remove) metal material from surfaces of the modified diamond particles. Acid (e.g., hydrochloric acid, hydrofluoric acid, nitric acid, etc.) may be provided in contact with the metal material using one or more conventional processes (e.g., a conventional immersion process, a conventional soaking process, a conventional spraying process, a conventional spin-coating process, a conventional vapor-coating process, etc.) and conventional processing equipment, which are not described in detail herein.

Figure 2:
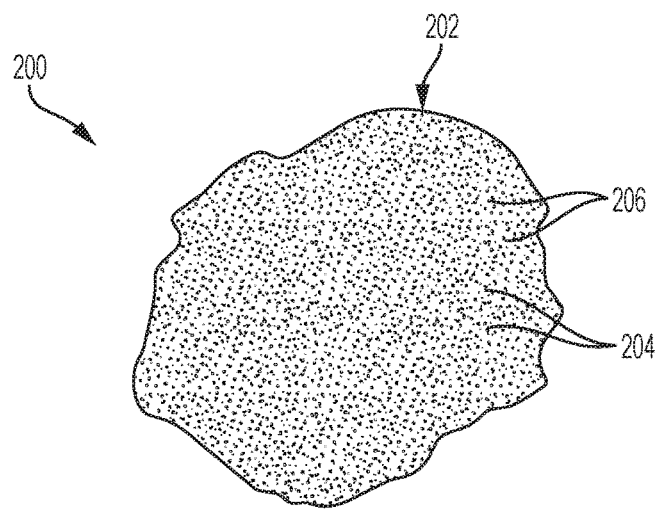
FIG. 2 is a simplified cross-sectional view of a diamond particle including a modified surface, in accordance with embodiments of the disclosure.

FIG. 2 is a simplified cross-sectional view of a modified diamond particle 200 formed in accordance with embodiments of the disclosure (e.g., through the method previously described with respect to FIG. 1). As shown in FIG. 2, the modified diamond particle 200 includes a textured surface 202 exhibiting elevated regions 204 and recessed regions 206 (e.g., grooves, pits, pores, openings, trenches, etc.) between the elevated regions 204. Lateral dimensions and lateral spacing of the recessed regions 206 may each be substantially uniform, and may respectively be substantially the same as lateral dimensions and lateral spacing of regions of a reactive phase (e.g., a reactive metal phase, such as a Ni phase, a Ni—Sn phase, etc.) of a spinodally decomposed alloy (e.g., a spinodally decomposed Cu—Ni alloy, a spinodally decomposed Cu—Ni—Sn alloy, etc.) and/or a spatially disordered alloy. Each of the recessed regions 206 may, for example, exhibit substantially the same width within a range of from about 1 nm to about 500 nm, and each of the recessed regions 206 may be separated from one or more other recessed regions 206 adjacent thereto by substantially the same distance within a range of about 1 nm to about 500 nm.

Figure 3:
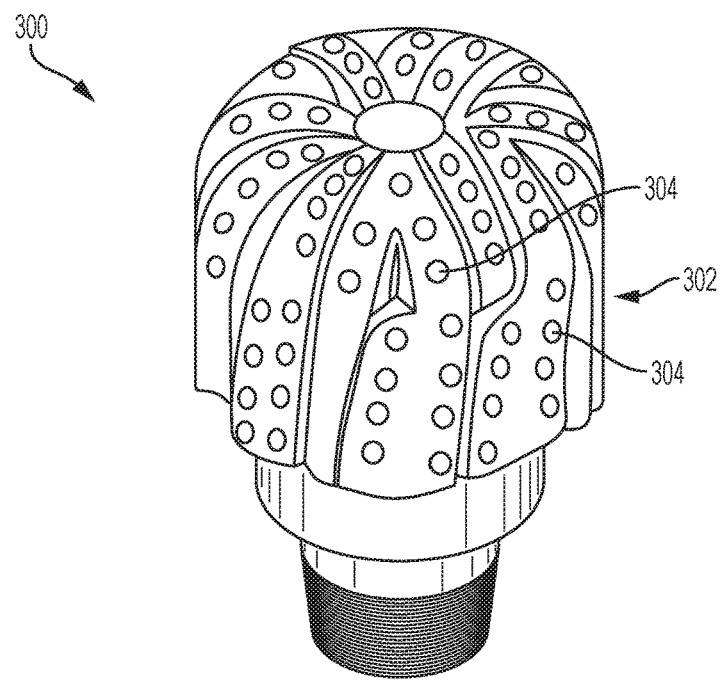
FIG. 3 is a perspective view of an embodiment of an impregnated drill bit, in accordance with embodiments of the disclosure.
Figure 4:
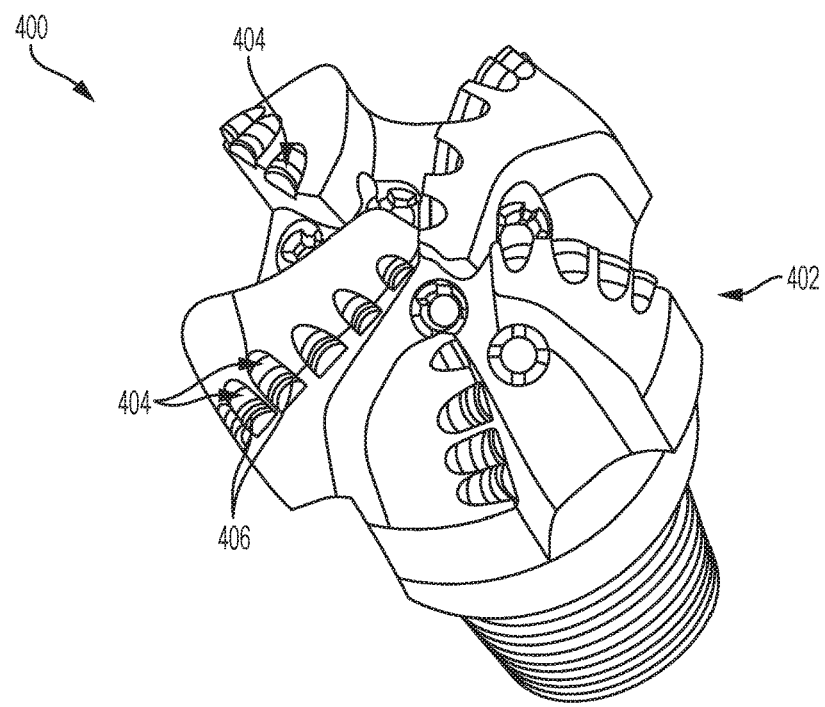
FIG. 4 is a perspective view of an embodiment of a fixed-cutter drill bit, in accordance with embodiments of the disclosure.

Embodiments of modified diamond particles (e.g., the modified diamond particle illustrated in FIG. 2) described herein and formed in accordance with embodiments of the disclosure (e.g., through the method previously described with respect to FIG. 1) may be utilized as desired. The modified diamond particles may, for example, be employed as components of one or more of a diamond-impregnated structure (e.g., an impregnated earth-boring tool, such as an impregnated earth-boring drill bit), a compact structure (e.g., a PDC), a coating material, a thermal composite material, a lubricant, a polishing media, and a filler material. In some embodiments, the modified diamond particles are employed in one or more downhole applications (e.g., drilling applications, conditioning applications, logging applications, measurement applications, monitoring applications, exploring applications, etc.). By way of non-limiting example, the modified diamond particles may be utilized in an earth-boring tool used to remove subterranean formation material. As used herein, the term "earth-boring tool" means and includes any type of tool used for drilling during the formation or enlargement of a wellbore in a subterranean formation and includes, for example, fixed-cutter drill bits, roller cone drill bits, impregnated drill bits, percussion drill bits, core drill bits, eccentric drill bits, bicenter drill bits, reamers, mills, drag drill bits, hybrid drill bits (e.g., rolling components in combination with fixed cutting elements), and other drilling bits and tools known in the art. By way of non-limiting example, FIG. 3 illustrates an impregnated drill bit 300 (e.g., impregnated earth-boring rotary drill bit) in accordance with embodiments of the disclosure. The impregnated drill bit 300 may include a bit body 302 and inserts 304 attached (e.g., brazed, welded, or otherwise secured) to the bit body 302. One or more (e.g., each) of the bit body 302 and the inserts 304 may be formed of and include at least one diamond-impregnated material including one or more of the modified diamond particles previously described herein. The diamond-impregnated material may, for example, include one or more of the modified diamond particles dispersed in a matrix of another material (e.g., tungsten carbide, a tungsten-cobalt alloy, elemental tungsten, combinations thereof, etc.). The bit body 302 and the inserts 304 may be formed through conventional processes (e.g., molding processes, high-temperature high-pressure processes, etc.), which are not described in detail herein. By way of additional non-limiting example, FIG. 4 illustrates a fixed-cutter drill bit 400 (e.g., fixed-cutter earth-boring rotary drill bit) in accordance with additional embodiments of the disclosure. The fixed-cutter drill bit 400 may include a bit body 402 and cutting elements 404 attached (e.g., brazed, welded, or otherwise secured) to the bit body 402. One or more of the cutting elements 404 may include a PDC 406 formed of and including one or more of the modified diamond particles previously described herein. The PDC may, for example, be formed of and include a volume of polycrystalline diamond (PCD) material including the modified diamond particles inter-bonded to another. In other words, PCD material may include direct, inter-granular bonds between the modified diamond particles. The bit body 402 and the cutting elements 404 (including the PDCs 406 thereof) may be formed through conventional processes (e.g., molding processes, high-temperature high-pressure processes, etc.), which are not described in detail herein.

While the disclosure has been described herein with respect to certain example embodiments, those of ordinary skill in the art will recognize and appreciate that it is not so limited. Rather, many additions, deletions and modifications to the embodiments described herein may be made without departing from the scope of the disclosure as hereinafter claimed. In addition, features from one embodiment may be combined with features of another embodiment while still being encompassed within the scope of the disclosure. Further, the disclosure has utility in drill bits having different bit profiles as well as different cutter types.

What is claimed is:
1. A method of modifying surfaces of diamond particles, comprising:
forming spinodal alloy coatings over discrete diamond particles while the discrete diamond particles are mobilized by a particle dispersing apparatus;
thermally treating the spinodal alloy coatings to form modified coatings each independently exhibiting a reactive metal phase and a substantially non-reactive metal phase; and
etching surfaces of the discrete diamond particles with at least one reactive metal of the reactive metal phase of the modified coatings.

2. The method of claim 1, wherein forming spinodal alloy coatings over discrete diamond particles comprises forming a spinodal alloy on each of the discrete diamond particles, the spinodal alloy comprising at least one metal element reactive with diamond at a temperature greater than or equal to about 650° C.

3. The method of claim 1, wherein forming spinodal alloy coatings over discrete diamond particles comprises forming one or more of a Cu—Ni spinodal alloy, a Cu—Ni—Sn spinodal alloy, and a Cu—Ni—Sn—Co spinodal alloy, a Au—Ni spinodal alloy, a Ni—Pt spinodal alloy, a Ni—Rh spinodal alloy, a Co—Ni—Fe spinodal alloy, a Co—Fe spinodal alloy, a Co—Pt spinodal alloy, and an Fe—Rh spinodal alloy.

4. The method of claim 1, wherein forming spinodal alloy coatings over discrete diamond particles comprises forming a Cu—Ni spinodal alloy over the discrete diamond particles, the Cu—Ni spinodal alloy comprising from about 50 wt % Ni to about 90 wt % Ni, and from about 10 wt % Cu to about 50 wt % Cu.

5. The method of claim 1, wherein forming spinodal alloy coatings over discrete diamond particles comprises forming a Cu—Ni—Sn spinodal alloy over the discrete diamond particles, the Cu—Ni spinodal alloy comprising from about 5 wt % Ni to about 35 wt % Ni, from about 6 wt % Sn to about 13 wt % Sn, and from about 52 wt % Cu to about 89 wt % Cu.

6. The method of claim 1, wherein forming spinodal alloy coatings over discrete diamond particles comprises:
forming a spinodal alloy; and
depositing the spinodal alloy over each of the discrete diamond particles.

7. The method of claim 1, wherein forming spinodal alloy coatings over discrete diamond particles comprises:
depositing spinodal alloy precursor coatings over each of the discrete diamond particles; and
converting the spinodal alloy precursor coatings into the spinodal alloy coatings.

8. The method of claim 1, wherein thermally treating the spinodal alloy coatings comprises:
heating the spinodal alloy coatings to a temperature above an upper critical solution temperature of a spinodal alloy thereof to form homogenized spinodal alloy coatings;
cooling the homogenized spinodal alloy coatings to a temperature below a temperature range of a spinodal region of the spinodal alloy to form quenched spinodal alloy coatings; and
heating the quenched spinodal alloy coatings to a temperature within the temperature range of the spinodal region of the spinodal alloy to form spinodally decomposed alloy coatings in accordance with a time-temperature-transition diagram.

9. A method of modifying surfaces of diamond particles, comprising:
forming spinodal alloy coatings over discrete diamond particles;

thermally treating the spinodal alloy coatings to form modified coatings each independently exhibiting a reactive metal phase and a substantially non-reactive metal phase;

selectively removing the substantially non-reactive metal phase of the modified coatings; and etching surfaces of the discrete diamond particles with at least one reactive metal of the reactive metal phase of the modified coatings after selectively removing the substantially non-reactive metal phase of the modified coatings.

10. The method of claim 9, wherein selectively removing the substantially non-reactive metal phase of the modified coatings comprises contacting the modified coatings with at least one wet etchant formulated to selectively etch the substantially non-reactive metal phase of the modified coatings relative to the reactive metal phase of the modified coatings.

11. The method of claim 9, wherein selectively removing the substantially non-reactive metal phase of the modified coatings comprises removing a Cu phase of the modified coatings without substantially removing a Ni-containing phase of the modified coatings.

12. The method of claim 11, wherein removing a Cu phase of the modified coatings without substantially removing a Ni-containing phase of the modified coatings comprises contacting the modified coatings with one or more of a $CuCl_2$ solution, a $FeCl_3$ solution, a $K_2Cr_2O_7$ solution, a $CH_3COOH$ solution, a chromic/sulfuric acid solution, an $H_2S_2O_8$ solution, an alkaline sodium chlorite solution, an alkaline peroxydisulfate solution, and an alkaline persulfate solution.

13. The method of claim 1, wherein etching surfaces of the discrete diamond particles with at least one reactive metal of the reactive metal phase of the modified coatings comprises heating the modified coatings to a temperature effectuating destruction of the crystallinity of portions of the discrete diamond particles by the at least one reactive metal.

14. The method of claim 1, wherein etching surfaces of the discrete diamond particles with at least one reactive metal of the reactive metal phase of the modified coatings comprises etching the surfaces of the discrete diamond particles with Ni.

15. The method of claim 1, wherein forming spinodal alloy coatings over discrete diamond particles comprises co-sputtering different metal atoms from different metal sources over surfaces of the discrete diamond particles while the discrete diamond particles are mobilized by the particle dispersing apparatus.

16. The method of claim 1, wherein forming spinodal alloy coatings over discrete diamond particles comprises sequentially sputtering different metal atoms from different metal sources over surfaces of the discrete diamond particles while the discrete diamond particles are mobilized by the particle dispersing apparatus.

17. The method of claim 1, wherein forming spinodal alloy coatings over discrete diamond particles while the discrete diamond particles are mobilized by a particle dispersing apparatus comprises forming the spinodal alloy coatings over the discrete diamond particles while the discrete diamond particles are mobilized by a vibrating structure.

18. The method of claim 1, wherein forming spinodal alloy coatings over discrete diamond particles while the discrete diamond particles are mobilized by a particle dispersing apparatus comprises forming the spinodal alloy coatings over the discrete diamond particles while the discrete diamond particles are mobilized by a fluidized bed.

19. The method of claim 1, further comprising removing the modified coatings from the etched surfaces of the discrete diamond particles.

20. The method of claim 19, wherein removing the modified coatings from the etched surfaces of the discrete diamond particles comprises treating the discrete diamond particles with at least one acid.

* * * * *